United States Patent
Hunt et al.

(10) Patent No.: US 7,351,449 B2
(45) Date of Patent: Apr. 1, 2008

(54) CHEMICAL VAPOR DEPOSITION METHODS FOR MAKING POWDERS AND COATINGS, AND COATINGS MADE USING THESE METHODS

(75) Inventors: Andrew T. Hunt, Atlanta, GA (US); Girish N. Deshpande, Atlanta, GA (US); Tzyy-Jiuan Jan Hwang, Alpharetta, GA (US); Nii Sowa Laye, Los Angeles, CA (US); Miodrag Oljaca, Avondale Estates, GA (US); Subramaniam Shanmugham, Duluth, GA (US); Shara S. Shoup, Woodstock, GA (US); Trifon Tomov, Duluth, GA (US); William J. Dalzell, Jr., Lawrenceville, GA (US); Aimee Poda, Atlanta, GA (US); Michelle Hendrick, Winder, GA (US)

(73) Assignee: n Gimat Co., Atlanta, GA (US)

( * ) Notice: Subject to any disclaimer, the term of this patent is extended or adjusted under 35 U.S.C. 154(b) by 199 days.

(21) Appl. No.: 09/748,714

(22) Filed: Dec. 21, 2000
(Under 37 CFR 1.47)

(65) Prior Publication Data

US 2002/0058143 A1    May 16, 2002

(51) Int. Cl.
*C23C 16/00* (2006.01)
*C23C 4/00* (2006.01)

(52) U.S. Cl. .................... 427/248.1; 427/446; 427/223

(58) Field of Classification Search ................ 427/446, 427/248.1, 255.23, 255.25
See application file for complete search history.

(56) References Cited

U.S. PATENT DOCUMENTS

| 4,235,616 | A | | 11/1980 | Siegfried |
| 4,689,112 | A | * | 8/1987 | Bersin ........................ 438/709 |
| 5,084,126 | A | * | 1/1992 | McKee .................. 156/345.33 |
| 5,534,314 | A | * | 7/1996 | Wadley et al. .............. 427/585 |
| 6,228,436 | B1 | * | 5/2001 | Affinito ...................... 427/497 |
| 6,287,643 | B1 | * | 9/2001 | Powell et al. ............... 427/562 |

FOREIGN PATENT DOCUMENTS

JP    63 182227 A    7/1988

OTHER PUBLICATIONS

Shutze et al "The Atmoshperic-Pressure Plasma Jet: A Review and Comparison to Other Plasma source" IEEE Transaction on Plasma Science, vol. 26, No. 5, Dec. 1998, 1685-1693.*
"Combustion" as defined by Hackh's Chemical Dictionary, 4th ed, 1969, p. 170.*
"Plasma" as defined by Hackh's Chemical Dictionary, 4th ed, 1969, p. 1, 527.*
"Combustion" as defined by dictionary.com.*

* cited by examiner

*Primary Examiner*—Timothy Meeks
*Assistant Examiner*—David Turocy (57) ABSTRACT

Flame produced vapors for combustion chemical vapor deposition are redirected from the direction of the flame by differential atmospheric pressure, such as positive pressure provided by a blower or negative pressure provided by a vacuum. This allows, for example, lower surface temperatures of substrates being coated with flame-produced vapors and coating of interior surfaces.

37 Claims, 6 Drawing Sheets

CHEMICAL VAPOR DEPOSITION METHODS FOR MAKING POWDERS AND COATINGS, AND COATINGS MADE USING THESE METHODS

GOVERNMENT CONTRACT

The United States government has rights in this invention pursuant to Contract No.DASG60-98-C-0084 awarded by the United States Department of Defense, and Contract Nos. DMI-9661724, DMI-9660598 and DMI-9801444 awarded by the National Science Foundation.

FIELD OF THE INVENTION

This invention relates to systems and methods for employing chemical vapor deposition to form powders and coatings, and more particularly, to systems and methods for controlling the deposition of a material to a substrate surface to form coatings and powders having improved characteristics.

BACKGROUND OF THE INVENTION

Recently developed chemical vapor deposition processes have been remarkably successful at allowing engineers and scientists to coat delicate substrates and to form coatings and powders having improved performance characteristics for certain applications. The success of methods like CCVD has, in part, increased the interests and desires of engineers to find new techniques and processes that will allow the treating and coating of still other substrates and the development of coatings suitable for new applications.

The chemical vapor deposition processes that have been so successful include the combustion chemical vapor deposition (CCVD) processes described in U.S. Pat. Nos. 5,652,021; 5,858,465; and 5,863,604, and issued to Hunt et al. These patents, which are hereby incorporated by reference, disclose methods and apparatus for CCVD of films and coatings wherein a reagent and a carrier medium are mixed together to form a reagent mixture. The mixture is then ignited to create a flame or the mixture is fed to a plasma torch. The energy of the flame or torch vaporizes the reagent mixture and heats the substrate as well. These CCVD techniques have enabled a broad range of new applications and provided new types of coatings, with novel compositions and improved properties.

U.S. Pat. No. 5,021,401, which issued on Jun. 4, 1991 to Snyder et al., discloses a process for the fabrication of nickel-oxide insulation on a superconductor. The superconducting wire may be a niobium-tin superconductor. Purified carbonyl is contacted with non-reacted niobium and tin on the surface of the wire, thereby coating the wire with a nickel sub-oxide. Several different superconductors are disclosed as being coated with nickel-oxide to form an insulative outer layer. The thickness of the nickel-oxide coating is between 1.5 to 20 microns, and however, it is noted that this technique may not produce a sufficiently resistive layer for thicknesses below 1.5 microns.

An insulated wire is taught in U.S. Pat. No. 5,091,609, which issued on Feb. 25, 1992 to Sawada et al. The wire has a conductor core, an anodic oxide layer and an oxide insulating layer. The conductor is disclosed as either aluminum-clad copper wire or pure aluminum wire. Dipping the wire into sulfuric acid and then applying a positive voltage to the wire forms the anodic oxide film on the outer surface of the aluminum. The oxide layer is then deposited on the anodic oxide film using the sol-gel method. Typical values for the thickness of the anodic oxide film are given as 10 to 20 microns with the total thickness of the oxide layers being between 20 and 40 microns. While the oxide insulators in this reference provide good electrical insulation and strength, the thicknesses of these oxide coatings are much larger than the thicknesses required for certain applications.

U.S. Pat. No. 5,468,557, which issued on Nov. 21, 1995 to Nishio et al. is drawn to a ceramic insulated electrical conductor wire. The method of making the wire is also discussed. The wire has a conductor core of copper or a copper alloy and a stainless steel layer around the copper core. A chromium oxide film is formed on the stainless steel layer, and a outer ceramic insulator is formed on the chromium oxide layer. To form the stainless steel clad copper wire, the core is inserted lengthwise into a stainless steel pipe, and plastically working the wire to provide the desired size. The stainless steel has sufficient chromium such that when oxidized a chromium oxide film is formed on the outer surface. The outer ceramic insulator is then vapor deposited onto the chromium oxide film. While the chromium oxide film is from 10 nm to about one micron in thickness, the overall thickness of the insulating oxide is about 3-4 microns thick. The chromium film is provided to increase adhesion between the stainless steel and the outer ceramic layer. Thus, the methods described in this reference provide oxide coatings that are several microns thick and the reference fails to describe how such oxide coatings may be employed as an insulator.

In addition to the above described oxide insulators, other materials have been used to produce insulators on electrical conductors. A Japanese lacquer coating for a conductor is discussed in U.S. Pat. No. 5,767,450, which issued on Jun. 16, 1998 to Furuhata. The coated conductor is designed for use in extremely small coils such as those found in electrical watches. While the coatings taught in this reference are indeed thin (as little as 0.1 micron thick), the materials used to deposit these Japanese lacquer coatings tend to break down at raised temperatures. In addition, the production of these coatings is environmental unfriendly.

Another useful application of the deposition methods described in the prior art is to produce various coatings on polymer products. In particular, deposition techniques have been employed to produce barrier layers for polymer-based food and beverage packaging materials. The requirements of these packaging materials (besides delivering the product) include flexibility (or rigidity in some applications) and as a barrier to gas transport (oxygen, carbon dioxide, water vapor, etc.), aroma and flavor. While these polymer containers are somewhat protective, they are not impermeable due to their physical properties and inherent amorphous regions. These regions allow the transport of oxygen and water vapor, resulting in degradation of the food product contained therein. The rate of transport of oxygen and water vapor is dependent on both temperature and the thickness of the polymer packaging. Obviously, the thicker the packaging, the more costly to manufacture. Barrier layers of another material (such as silica) greatly reduce the permeability of the polymers on which they are coated, as well as increasing the scratch resistance or controlling the tribology of the outer surface of the packaging. The prior art methods of producing these barrier layers use vacuums, CVD and other complex or environmentally unsafe practices. Moreover, the adhesion levels between the polymer surface and the barrier layer have been low creating a risk of contamination as material may flake off the package and mix with the food or beverage.

U.S. Pat. No. 5,085,904, which issued on Feb. 4, 1992 to Deak et al. discloses barrier materials useful for packaging. A multi-layer structure is shown including a resin substrate, a layer of SiO vacuum deposited thereon, a layer of $SiO_2$ vacuum deposited on the SiO layer and a protective outer layer of adherent plastic resin. The resin substrate may be a polyester resin or a polyamide resin. The silicon layers are all disclosed as being vacuum deposited and therefore the methods to form these coatings require vacuum equipment and have other disadvantages.

U.S. Pat. No. 5,683,534, which issued on Nov. 4, 1997 to Löfgren et al. and European Patent Specification EP 0 385 054 B1 published Sep. 5, 1990 both teach a method for the manufacture of laminated packaging material. The laminated material is a good gas and aroma barrier. The barrier layer is applied to the base layer using vacuum deposition, and includes an intermediate layer of bonding material. To aid in the package manufacturing, the barrier layer is omitted from areas that are intended to be folded.

A transparent high barrier multi-layer structure is described in U.S. Pat. No. 5,916,685, which issued on Jun. 29, 1999 to Frisk. In one embodiment of the structure, a layer of SiOx is deposited onto a polymer, x being between 1.5 and 2.5. The SiOx may be deposited using a number of different methods, although plasma-enhanced CVD is preferred. The polymer is selected from the group consisting of polyamides, polyethylene terephthalate, copolymers of polyethylene terephthalate and mixtures thereof. A clay mineral is integrated into the polymer. As with other prior art laminates, these products are produced using methods that have inherent disadvantages, including contamination due to poor adhesion and bonding.

None of the above references and patents, taken either singly or in combination, is seen to describe the instant invention as claimed.

SUMMARY OF THE INVENTION

The present invention is directed to methods of coating and powder materials processing, including chemical vapor deposition (CVD), wherein the activating energy source and/or the active deposition gasses produced thereby are redirected and redistributed, to control the material properties, decrease the gas temperature or increase the substrate area coated by the deposition material. In addition, by directing the deposition gasses, vapor clusters and particles in a direction different than the heat produced by the energy source, it is possible to control the substrate temperatures to allow deposition to occur without damaging the substrate. In CVD, an energy source (thermal, electromagnetic, flame, plasma, etc.) provides the necessary energy for the coating precursors to react and thereby form the material used to coat a substrate. The energy source is directed toward the substrate, to heat at least a portion of the substrate so that the precursors may become activated such that deposition occurs. By redirecting the activated materials, the method of the present invention goes beyond conventional chemical deposition by allowing a more efficient distribution of the deposition species in the gasses. At the same time, the precursors are allowed to attain the appropriate temperatures for forming the coating compositions, while avoiding overheating and damaging the substrate itself. Furthermore, the redirected gasses are more thoroughly mixed, and therefore provide a more homogeneous coating and heat distribution on the substrate. This is particularly useful in the production of the barrier or electrochemical coatings on polymers, as well as protective or insulating coatings for metal foil and electromechanical windings.

When used to redirect the combustion source in a CCVD process, the present invention provides the same advantages over other thin-film technologies (such as CVD) as does conventional CCVD. One advantage of CCVD is its ability to deposit films in the open atmosphere without any costly furnace, vacuum, or reaction chamber. As a result, the initial system capitalization requirement can be reduced up to 90% compared to a vacuum-based system. Instead of a specialized environment, which is required by other technologies, a combustion flame provides the necessary environment for the deposition of elemental constituents from solution, vapor, or gas sources. The precursors are generally dissolved in a solvent that also acts as the combustible fuel. Depositions can be performed under conditions of atmospheric pressure and temperature, such as within an exhaust hood, outdoors, or within a chamber for control of the surrounding gasses or pressure.

Because CCVD generally uses solutions, a significant advantage of this technology is that it allows rapid and simple changes in dopants and stoichiometries which eases deposition of complex films. The CCVD technique generally uses inexpensive, soluble precursors. The Nanomiser™ as described in co-pending U.S. patent applications Ser. No. 08/691,853, filed Aug. 2, 1996, (now U.S. Pat. No. 5,997,956), and U.S. patent applications Ser. Nos. 09/293,867, 09/293,028 and 09/293,030, all filed Apr. 16, 1999 as divisionals of U.S. patent application Ser. No. 08/691,853, breaks the liquid into micron or even sub-micron sized droplets. These patent applications are hereby incorporated by reference. In addition, precursor vapor pressures generally do not play a role in CCVD because the dissolution process provides the energy for the creation of the necessary ionic constituents. By adjusting solution concentrations and constituents, a wide range of stoichiometries can be deposited quickly and easily. Additionally, the CCVD process allows both chemical composition and physical structure of the deposited film to be tailored to the requirements of the specific application.

Unlike conventional CVD, the CCVD process is not confined to an expensive, inflexible, low-pressure reaction chamber. Therefore, the deposition flame, or bank of flames, can be moved across the substrate to easily coat large and/or complex surface areas. Because the CCVD process is not limited to specialized environments, the user can continuously feed materials into the coating area without disruption, thereby permitting batch processing. Moreover, the user can limit deposition to specific areas of a substrate by simply controlling the dwell time of the flame(s) on those areas. Finally, the CCVD technology generally uses halogen-free chemical precursors having reduced negative environmental impact.

The present invention has all of the above described advantages of conventional CCVD, and additionally provides for greater and more even distribution of the deposition gasses, while allowing the use of CVD, CCVD or any other chemical deposition process to coat substrates that would be otherwise oxidized, melted, cracked or damaged by the direct heat from the hot gasses or the energy source. In a first embodiment, a secondary stream (jet) of gasses that may contain liquids or solids is directed toward the active deposition gasses emerging from the energy source to cause the coating constituents to be carried to the substrate without actually pointing the precursor gas source directly at the substrate. This secondary stream may be compressed air, oxygen, nitrogen, argon, hydrogen, helium or other gasses, or combination of gasses or may contain droplets of a liquid and/or solids comprised of part or all of a second precursor solution or materials that will also be incorporated into the powders or deposited coating. When the jet includes constituents that form the coating, these constituents are to be directed at the combustion source such that they reach the temperatures for forming the coating. As the combustion source usually creates a material flow of its own, the combination of the jet and the combustion source forms a resulting flow of somewhat cooler deposition gasses that are directed at the portion of the substrate where deposition is desired. This "aiming" is a simple process that once set up, does not need to be re-aimed unless deposition parameters (flow rates, precursor density, etc.) change.

When the material expelled by the redirect jet does not require energy to form part of the powders or coating, or is not used to form the powders or coatings, the jet does not need to be oriented directly toward the energy source, but can be directed slightly above, below or to the side of the energy source. This results in a pressure differential that bends the energized gasses without directly cooling the energy source itself. In most cases it is not desired to limit the temperatures that can be attained within the energy source. By adjusting the flow rates and the velocity of both the redirect jet and the primary flow into the energy source, the temperature within the flame remains high enough to form the coating from the precursor solution, while still reducing the temperature the substrate is heated to by the precursor activation energy zone. In addition, the interaction of the air/gas jet and the energy source, (which often has a vector of its own, such as a flame) results in vigorous mixing of the hot deposition gasses thereby decreasing the temperature and concentration gradients, and directing the deposition materials to the desired portion of the substrate. After reaction of the precursor, the resulting species (deposition materials) will usually have a very low vapor pressure, which results in a supersaturated vapor that will rapidly condense. The secondary gas stream acts to dilute the deposition gasses, which decreases the rate of gas phase cluster growth, and accelerates the active vapor clusters to the substrate surface, which decreases the time for cluster growth. It is important for many types of coatings to maintain the deposition species as vapor (sub-critical nucleus sized clusters) until reaching the substrate so that absorption and some surface diffusion can occur. Exact temperature control provides control of diffusion. In some cases (i.e. catalysts) it may be desired to have very little diffusion to obtain the best material properties. To minimize such interfacial diffusion/reaction, the present invention reduces the diffusion/reaction rate by using a redirect source to thereby maintain a low substrate temperature. An air/gas jet is used to quickly cool down a CCVD flame and direct coating constituents to the substrate surface. The resulting coating is hence deposited at much lower temperatures. The film is maintained at the same quality as those deposited at high temperatures because the high-speed gas jet shortens the travel distance of the coating constituents to the substrate. The shorter travel distance and the diluted deposition vapor stream prevent coating constituents from coarsening or agglomerating. Therefore, the film deposited using the gas jet-assisted CCVD remains dense rather than powdery or grainy, a condition that can occur with low CCVD deposition temperatures. Furthermore, a high velocity jet can help break up the gas boundary layer thereby increasing the deposition rate and providing a more uniform coating thickness on substrates including unusual shapes and rough surfaces.

It is important to note that the activated deposition materials can range in state. These species can be stable gasses, vapors below their saturation point, vapors above their saturation point as molecules or growing clusters and even stable particles (powders). For each material, the process provides for the formation of material through chemical change within an energized environment, and then rapidly changes the environment through secondary gas flows which may contain deposition nuclei and/or additional deposition (or powder forming) materials. This change in the energized (or local) environment can include diluting the powder or deposition material or cooling the powder or deposition material as it leaves the energized zone. The dilution of the material by adding additional material via the redirect jet can be by 10%, 30%, 60%, 100% or even greater. The percentage cooling of the material is measured with respect to the difference between the energy source and the substrate. For example, if the energy source yields gasses and materials at about 700° C. and the substrate temperature is about 100° C., and the redirect cools the material to 400° C., then the percentage of cooling would be 300° C./600° C. or 50%. This cooling can be 10%, 25%, 50%, 75% or greater, but would not under normal conditions be greater than 100% for coating applications. The energized or localized environment is of course dependent upon the actual power delivered by the energy source. For most applications this zone extends out to 2-20 cm from the energy source. The resulting material formed from the process can be collected as powders or may be used to form a coating. The chemically changed material could even be all particles (not vapor) and collected, sintered onto a substrate or co-deposited with an interstitial or matrix material.

Another method of redirecting the energized gasses is through the use of a vacuum source. The energized gasses are directed in a first direction at an angle relative to the substrate. A vacuum source is placed at a point such that the flame, plasma or heat of the energy source bends toward the substrate. As with the previous embodiments, the result is an energy or combustion source that is hot enough to form the active species coating that does not directly overheat the substrate. An additional advantage of using a vacuum source, is the fact that additional oxidizing materials (such as air or oxygen) are not added to the combustion source. This is useful when materials that are sensitive to the presence of oxygen are used. It should further be noted that in addition to multiple vacuum or pressurized jet sources, multiple CCVD nozzles or energy/material sources may be used to increase the rate of deposition. As the CCVD process does not require a vacuum chamber, in CCVD embodiments, the multiple jets, vacuums and CCVD nozzles are easily adjusted to produce the desired resultant deposition gas direction.

As previously stated one particular use of the deposition methods of the present invention is to form thin film, insulative oxide coatings on conductors. These conductors can be used in electromagnetic components in the form of a wire, (such as transformers, coils, motors, solenoids, relays, etc.) wherein a conductor or wire is wrapped or otherwise configured in closely packed stacks or windings. In these components, the thickness of the insulation that isolates each layer or winding from adjacent layers or windings has a substantial impact on the efficiency of the device. This is due to the fact that the cross sectional area occupied by the insulated portion of the windings does not carry electrical current, and therefore does not produce magnetic flux. By reducing the thickness of the insulative coating, the magnetic flux and field strength produced by an actuator of a given size is increased. For relatively large diameter wire, the reduction of the thickness of the insulator has a minor effect. In devices using small diameter conductors, however, the thickness of the insulator has a large impact on the efficiency of the device. As electronic components are being produced smaller and smaller, the need for higher efficiency miniature electromagnetic devices continues to increase. The thin film insulative coatings of the present invention provide extremely thin insulation, while also providing the electrical resistance between adjacent windings and other components.

Oxide insulators are also useful in cable applications as well. Increased conductor cross sections relative to the overall cable cross section allow higher currents in the same conduit space. An oxide coating can be provided to reduce the total insulator thickness, while increasing the overall breakdown voltage. An outer coating of a thinner, polymer-containing coating may be placed on top of the oxide coating to protect the oxide from abrasion as well as adding additional dielectric material.

One type of coated wire of the present invention is amorphous silica on copper. These materials are relatively inexpensive and have been used to produce low cost insulated wiring in the past. The methods described herein, however, produce insulated copper wiring with extremely thin (less than 0.5 micron) insulation having high electrical breakdown voltages (over 400 V). Of course, it should be understood that in low-voltage applications (such as many electromagnetic devices), usable breakdown voltages may be much lower (5-75 V). It is notable, however, that even very thin (less than 50 nm) continuous coatings made using the methods of the present invention will have breakdown voltages of at least 5 V. To form these coatings, the wire is wound on a supply reel (as is common in wire manufacturing). The wire is routed in the vicinity of the energy source of a CVD coating apparatus, and then to a take-up reel. In this manner, the wire can be continuously coated with a relatively simple coating apparatus. As the surface of the copper will oxidize if too high of a temperature is reached, the combustion source is redirected to reduce heat transfer to the copper.

A second type of coated wire disclosed herein involves wires having a core of low temperature superconducting material surrounded by a sleeve of copper or bronze. As with solid copper wires, these composite wires can be provided with thin film, oxide insulation using the redirect CCVD methods described herein.

In addition to coated wires, the redirect CCVD methods disclosed herein are also useful for forming planar passives (resistors and capacitors) on conductive substrates. As with other materials, the redirect methods allow oxide coatings to be formed on pure conductive materials (such as copper), while reducing the oxidation of the conductive substrate that can decrease the interaction between the passive component and the conductive interconnects. A more detailed description of the passive deposition techniques is described in co-pending U.S. patent application Ser. No. 09/069,679 filed Apr. 29, 1998, U.S. patent application Ser. No. 09/198,285 filed Nov. 23, 1998 and U.S. patent application Ser. No. 09/198,954 filed Nov. 24, 1998, all of which are hereby incorporated by reference.

Other material that the redirect methods disclosed herein are useful for depositing include electronic resistive materials as taught in co-pending U.S. patent application Ser. No. 09/069,427 filed Apr. 29, 1998 and entitled RESISTORS FOR ELECTRONIC PACKAGING. In the formation of these resistive materials a wide range of precursors can be used as gas, vapor or solutions.

It is preferred to use the lowest cost precursor, which still yields the desired morphology. Suitable chemical precursors, not meant to be limiting, for depositing various metals or metalloids are as follows:

| | |
|---|---|
| Ag | silver nitrate, silver trifluoroacetate, silver acetate, silver cyclohexanebutyrate, silver 2-ethylhexanoate |
| Al | aluminum nitrate nonahydrate, aluminum acetylacetonate, triethylaluminum, aluminum sec-butoxide, aluminum iso-propoxide, aluminum bis(2-ethylhexanoate)monohydroxide |
| Au | chlorotriethylphosphine gold (I), chlorotriphenylphosphine gold (I) |
| B | trimethylborate, trimethoxyboroxine |
| Ba | barium 2-ethylhexanoate, barium nitrate, barium acetylacetonate hydrate, bis(2,2,6,6-tetramethyl-3,5-heptanedionato)barium hydrate |
| Bi | bismuth (III) nitrate pentahydrate, bismuth (III) 2-ethylhexonate |
| Cd | cadmium nitrate tetrahydrate, cadmium 2-ethylhexanoate |
| Ce | cerium (III) 2-ethylhexanoate |
| Cr | chromium (III) nitrate nonahydrate, chromium (III) 2-ethylhexanoate, chromium (III) sulfate hydrate, chromium hexacarbonyl, chromium (III) acetylacetonate |
| Cu | copper (II) 2-ethylhexanoate, copper (II) nitrate trihydrate, copper (II) acetylacetonate hydrate |
| Co | cobalt naphthenate, dicobalt octacarbonyl, cobalt (II) nitrate hexahydrate |
| Fe | iron (III) nitrate nonahydrate, iron (III) acetylacetonate |
| In | indium (III) nitrate hydrate, indium (III) acetylacetonate |
| Ir | dihydrogen hexachloroiridate (IV) hydrate, iridium (III) acetylacetonate, dodecacarbonyltetrairidium |
| K | potassium ethoxide, potassium tert-butoxide, 2,2,6,6-tetramethylheptane-3,5-dionato potassium |
| La | lanthanum (III) 2-ethylhexanoate, lanthanum (III) nitrate hexahydrate, lanthanum (III) acetylacetonate hydrate, lanthanum (III) iso-propoxide, tris(2,2,6,6-tetramethyl-3,5-heptanedionato)lanthanum (III) |
| Li | 2,2,6,6-tetramethylheptane-3,5-dionato lithium, lithium ethoxide lithium tert-butoxide |
| Mg | magnesium naphthenate, magnesium 2-ethylhexanoate, bis(2,2,6,6-tetramethyl-3,5-heptanedionato)magnesium dihydrate, magnesium acetylacetonate, magnesium nitrate hexahydrate |
| Mo | ammonium molybdate tetrahydrate, molybdenum hexacarbonyl, molybdenum (IV) dioxide bis(acetylacetonate) |
| Na | 2,2,6,6-tetramethylheptane-3,5-dionato sodium, sodium ethoxide, sodium tert-butoxide |
| Nb | niobium (V) ethoxide, tetrakis(2,2,6,6-tetramethyl-3,5-heptanedionato) niobium (IV), niobium (IV) (2-ethylhexanoate) |
| Ni | nickel (II) nitrate hexahydrate, nickel (II) acetylacetonate, nickel (II) 2-ethylhexanoate, nickel (II) napthenate, nickel carbonyl |
| P | triethylphosphate, triethylphosphite, triphenylphosphite |
| Pb | lead (II) 2-ethylhexanoate, lead naphthenate, bis(2,2,6,6-tetramethyl-3,5-heptanedionato)lead (II), lead (II) nitrate |
| Pd | diamminepalladium (II) nitrite, palladium (II) acetylacetonate, ammonium hexochloropalladate (IV) |
| Pt | platinum (II) acetylacetonate, platinum (II) hexafluoroacetylacetonate, diphenyl(1,5-cyclooctadiene)platinum (II), diammineplatinum (II) nitrite, tetraammineplatinum (II) nitrate |
| Ru | ruthenium (III) acetylacetonate |
| Si | tetraethoxysilane, tetramethylsilane, disilicic acid, metasilicic acid |
| Sn | tin (II) chloride dihydrate, tin (II) 2-ethylhexanoate, tetra-n-butyltin, tetramethyltin |
| Sr | strontium nitrate, strontium 2-ethylhexanoate, bis(2,2,6,6-tetramethyl-3,5-heptanedionato)strontium hydrate |
| Ti | titanium (IV) iso-propoxide, titanium (IV) acetylacetonate, titanium (di-iso-propoxide)bis(acetylacetonate), titanium (IV) n-butoxide, titanium (IV) 2-ethylhexoxide, titanium (IV) oxide bis(acetylacetonate) |
| W | tungsten hexacarbonyl, tungsten (VI) fluoride, tungstic acid |
| Y | yttrium (III) 2-ethylhexanoate, yttrium (III) nitrate hexahydrate, yttrium (III) iso-propoxide, yttrium (III) napthoate |
| Yb | ytterbium (III) nitrate pentahydrate |
| Zn | zinc 2-ethylhexanoate, zinc nitrate hexahydrate, zinc acetate |

-continued

Zr  zirconium (IV) 2-ethylhexanoate, zirconium (IV) n-butoxide, zirconium (IV) hexafluoroacetylacetonate, zirconium (IV) acetylacetonate, zirconium (IV) n-propoxide, zirconium dinitrate oxide The deposition methods of the present invention are also suitable for forming barrier layers on polymer-based, food product containers. Polymer containers for food have been used for many years, as they are less expensive and lighter than their glass and/or metal counterparts. In addition, polymer containers can be flexible and are less breakable than glass. Some of the polymers used to form these containers include polyesters, polyamides and polyolefins. One disadvantage of low cost, polymer-based containers, is their inability to provide a sufficient barrier to the transmission of oxygen, carbon dioxide, water vapor and other gaseous media. To reduce this transmission, the internal and/or external surfaces of the containers are coated with a barrier layer of metallic oxide. These barrier layers can be difficult to form on the polymers' surface, requiring vacuum chambers, adhesives or other costly, slow and environmentally unsafe batch methods. Conventional CVD methods, as previously disclosed in the above-mentioned U.S. Patents, are unsuitable for forming these coatings as the direct heat can damage the polymers being coated. The disclosed redirect CVD methods, however, provide the heat for the activation of the precursors, while avoiding over heating of the polymer surface.

Materials that can be used to form the barrier layers include but are not limited to inorganic metal oxides such as silica, magnesia, zinc oxide, zirconia, titania, chromia, and ceria. Silica ($SiO_2$) is preferred as a low-cost material that exhibits a high degree of impermeability. The silica coatings of the present invention are not only relatively inexpensive to produce, but can have additional surface texturing to provide a highly adhesive surface (particularly relative to polymers) for printed subject matter, as is almost always applied to the outer surface of food containers.

In addition to the methods and materials described above, the use of the CCVD method also provides for easily modifying the surface of the polymers to increase the adhesion between the polymer and the metal oxide barrier layer. One method for modifying the polymer surface is by incorporating oxygen ions ($O_2^-$) into the polymer surface, thereby increasing the strength of the bond between the oxygen and the polymer molecules. This is particularly easy using the CCVD methods of the present invention, as oxygen is already supplied to the combustion source to form the metal oxide coatings. By simply providing some ionized oxygen or oxygen containing radicals, the adhesion between the oxide and the polymer can be greatly enhanced. In this manner, the adhesion is increased at the same time the deposition is made, without the need for an addition process or apparatus.

Another method of modifying the surface of the polymer is by doping the silica with platinum, alkaline earth metals (Group IIA) such as magnesium, calcium, strontium, or barium, or alkali metals (Group IA) such as sodium or potassium. When used to coat polyacids, polyamides or polyesters such as polyethylene terephthalate (PET), the alkali metal, alkaline earth metal or platinum bonds to the carbon-oxygen double bond in the polymer. The atoms of the dopant thereby act as a bridge, adhesion promoter, between the polymer and the silica layers of the laminate. As with the ionized oxygen, the alkali metals, alkaline earth metals or platinum are easily co-deposited using the deposition methods disclosed herein. This is accomplished by simply dissolving the metal into the silica precursor solution. Alternatively, a very thin coating, ranging in thickness between a partial layer to tens of angstroms thick, of the adhesion promoter is first applied, followed by a better diffusion inhibitor. These thin layers can also be used to increase or decrease the bonding of inks, glues and other desired additional processing or end use properties.

The gas barrier properties of a barrier coating may be enhanced by providing alternating layers of different composition. For example, layers of an alkaline earth metal oxide or mixture of alkaline earth metal oxide may be alternated with layers entirely of silica. The different crystalline structures of the several layers creates a tortuous pathway for gases to flow through any porosity. The inner layer is typically the alkaline earth metal oxide-containing layer as this adheres better to the polymer than does the pure silica. The relative molar ratio of the alkaline earth metal oxide to silica in these layers ranges from 100% down to 5 to 95. A preferred multi-layer structure comprises alternating layers of MgO/silica, 75:25 molar ratio, with silica layers. In such multi-layer structures, the individual layers range in thickness from about 2 to about 150 nanometers. The number of layers in such a structure may range from 2 upward, 10 layers being a practical upper limit.

There is evidence that when the inner sublayer of a barrier coating comprises silica plus an alkaline earth metal, a mixed silicon/alkaline earth metal oxide forms. For example it is believed that in a silica/MgO layer, some magnesium silicate forms. Such mixed oxides are believed further to bond with carbonyl groups of carbonyl group-containing polymers, such as polyethyleneterephthalate, polycarbonate, or polyamide, thereby enhancing adhesion.

If an inorganic barrier coating is used to coat a polymeric material, such as a polyethyleneterephthalate bottle, increased stability of the barrier coating, e.g., against cracking, may be achieved by providing an outer layer of polymer between about 20 and about 1500 nanometers thick. Polyesters that may be dissolved in a solvent, such as polyethylene terephthalate, may be applied as a lacquer over the coating and dried. Polysiloxane may be produced as an outer layer by depositing a solution of polysiloxane precursors and applying thermal energy to evaporate solvent and cure the precursors.

In the formation of many laminates, including some of the various applications discussed above, the laminate may include an organic substrate upon which a surface layer is deposited for providing wear and/or corrosion resistance. These surface layers may be formed of at least one material chosen from the exemplary group consisting of but not limited to silica, chromia, ZnO, alumina, titania, magnesia, copper, nickel, gold, WC and TiN. In between these layers, a laminate-interface layer may be deposited for increasing the adhesion between these two layers. The laminate-interface layer may comprise at least one material chosen from the group consisting of Pt, Pd, CuO, $Cu_2O$ and carbon or silicon based polymers. As with the previous discussed materials, these layers are effectively deposited using the redirect methods of the present invention.

The redirect can also be used to control the cluster or particle size of electrochemical materials and nanopowders where high surface areas are often desired. Without sufficient redirect with its dilution and cooling effects, the deposition species would form larger vapor clusters or form dense coatings. It is less energy intensive to expose less material to the high energy zone, but at a higher precursor concentration undesirable materials may be formed. Thus the secondary stream, can also save manufacturing costs, while better controlling the coating surface morphology, or in forming powders the particle size can be more accurately controlled.

The redirect can even further be used, for example, to form the structures disclosed in the previously discussed, co-pending U.S. patent application Ser. No. 09/316,855 entitled MATERIALS AND PROCESSES FOR PROVIDING FUEL CELLS AND ACTIVE MEMBRANES. The materials disclosed in this application (such as a catalyst, platinum and Nafion®, a polymeric membrane), can be easily co-deposited using the redirect methods of the present invention. While the catalyst material such as platinum, may be in a precursor solution that requires a relatively high energy source temperature to form the deposition material, the polymeric material may degrade at these temperatures. To this end, the platinum precursor may be fed directly into the energy source (such as a CCVD flame, for example), while the Nafion® solution is sprayed into the deposition gasses in the form of a redirect jet. The result is an intimately mixed deposition of these materials without degradation of the more sensitive materials. Moreover, platinum densities can be achieved that are three times that produced by currently used methods at similar platinum particulate size. For example, with 2 nanometer platinum particulate size, 60 wt % platinum loading is achievable as compared to 20% achievable with other current methods.

As previously discussed, the disclosed methods are also useful in the production of powders as well as coatings. In order to form these powders, some type of powder collection mechanism may be employed. Any type of these mechanisms may be used, including but not limited to filters, bubblers, scraped surfaces (such as rotating drums) and trap zones. It is considered well within the skill level of the average worker in the art of powder manufacturing to design a collection mechanism for the production of powders, and follow from principles known in the art, including those set forth in U.S. Pat. No. 5,277,705 issued on Jan. 11, 1994 to Anderson et al. and hereby incorporated by reference.

Accordingly, it is a first object of the invention to provide a redirected chemical deposition method for producing a coating on a substrate, to more evenly distribute the coating material and the heat from the energy source over a surface of the substrate.

It is a second object of the invention to provide a redirected chemical deposition method for producing a coating on a substrate, to reduce the amount of heat transferred to the substrate to reduce the possibility of the heat from the energy source damaging the substrate.

It is another object of the invention to redirect the energy source or hot gasses produced thereby in a chemical deposition method using a jet of liquid or gaseous material directed at the material resulting from exposure to some of the energy source.

It is a further object of the invention to redirect the energy source in a chemical deposition method using a jet of liquid or gaseous material directed near the energy source, to thereby produce a local differential pressure zone.

It is yet another object of the invention to redirect the energy source in a chemical deposition method using a vacuum source.

It is yet a further object of the invention to uniformly premix gasses in a chemical deposition method and increase the substrate area contacted by these gasses.

It is still another object of the invention to provide insulative, thin film, oxide coatings on electrical conductors.

It is another object of the invention to increase the efficiency of electromagnetic devices by reducing the thickness of the insulators on the windings of these devices, while providing the required insulation between adjacent windings and other components.

It is still yet another object of the invention to provide barrier layers of metal oxide coatings on polymer-based, food product containers.

It is yet an additional object of the invention to provide thin film layers for increased adhesion or to modify surface wetting.

These and other objects of the present invention will become readily apparent upon further review of the following specification and drawings.

DETAILED DESCRIPTION OF THE ILLUSTRATED EMBODIMENTS

The present invention may be understood more readily by reference to the following detailed description of certain illustrated embodiments of the invention and the Figures. The embodiments described herein include systems and methods for performing a chemical deposition method wherein the activated source and/or the hot gasses produced thereby are redirected during the deposition process. For example, in one aspect, the invention provides systems for redirecting or "vectoring" the reactive species and/or the hot deposition gasses generated during a deposition process. This redirect may be accomplished by providing a jet of air, gas or liquid, (or a combination thereof) that is directed toward or near the energy environment, or by a vacuum source placed close to the energy environment. Redirecting the deposition gasses is understood to allow for more uniform distribution of the coating material over the substrate surface, thereby increasing deposition efficiency and improving film thickness uniformity. In addition, by redirecting the activated source, lower substrate temperatures can be used during the deposition process, thereby reducing oxidation or other degradation of the substrate material itself.

One particular application of the present invention is the use of gas flow redirection with combustion chemical vapor deposition (CCVD). As with conventional CCVD processes, the present deposition method provides many advantages over other deposition techniques when used with CCVD. Thus, the method of the present invention makes it possible to use the advantages of CCVD to produce powders or coatings on substrates that might otherwise be damaged by the temperature of the combustion source required for the CCVD process. The coatings and coated substrates, such as oxide insulative coatings on conductive substrates and metal oxide coatings for polymer food and beverage containers may be made using the methods described herein. Of course, it should be understood that this method can be used with any chemical deposition process, and the terms flame, combustion, vapor, and activation, heat or energy source or zone, are used interchangeably in the context of this patent application and should not be construed as limiting.

Figure 1:
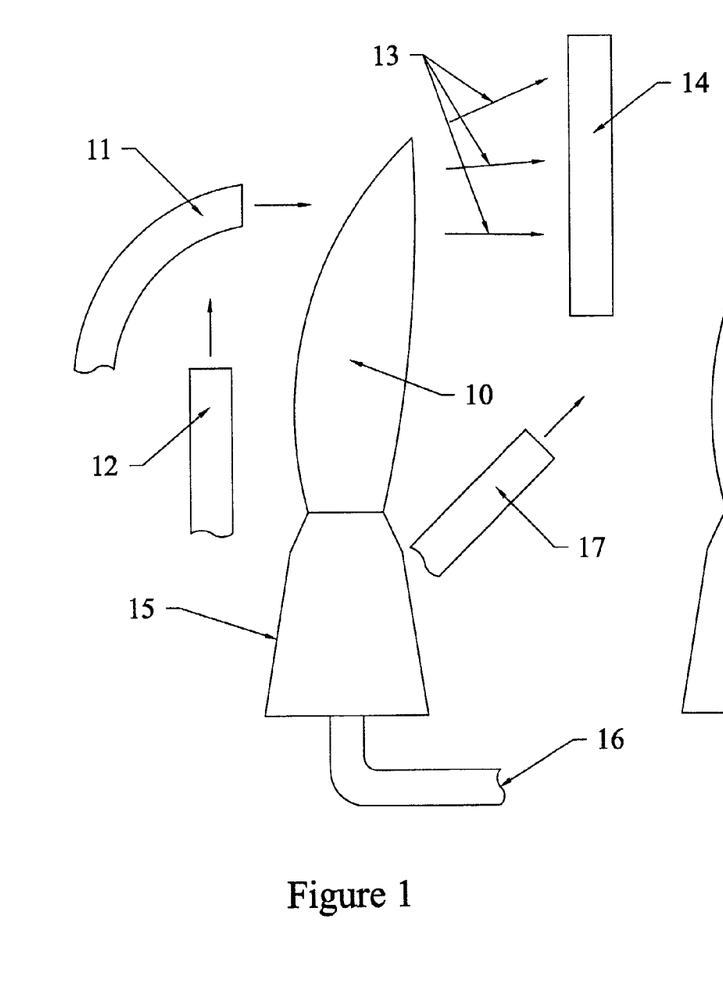
FIG. 1 is a schematic of a jet-equipped embodiment of the redirect CCVD apparatus of the present invention.

Turning now to FIG. 1, one apparatus for redirecting the energy, heat or combustion (CCVD) source is shown. Specifically, FIG. 1 depicts a device that includes a nozzle 15 that provides a precursor material, that is directed along a first path that is generally coincident with the longitudinal axis of the nozzle 15. The nozzle 15 may comprise any suitable nozzle assembly, such as for example, the nozzle assembly described in the above mentioned U.S. Pat. No. 5,858,465. The nozzle assembly may include an ignition mechanism that may ignite, at least partially, the precursor material being ejected from the nozzle 15. The ignition mechanism may be a pilot light, a sparker, or any other suitable mechanism for igniting the precursor material. The ignition mechanism creates a combustion zone 10 (shown here as a flame) that may be redirected along a second path by a jet of gas or liquid pointed either directly 11 or indirectly 12 and 17 at the combustion source 10. The redirecting of the activated precursor 13 results in a deposition of a coating onto a substrate 14. It should be noted that the direction and position of the redirect jet (11, 12 or 17) are chosen here merely to be illustrative. The actual angle and distance between the CCVD nozzle 15, and the redirect jet (11, 12 or 17), would be chosen based on the specific deposition parameters (i.e. required flame and substrate temperatures). To this end, one or all of the redirect jets (11, 12 or 17) may be mounted to respective pivoting mechanisms for adjusting an angle at which the redirect jets (11, 12 or 17) act on the combustion zone 10. The pivoting mechanism may include a mechanical actuator, such as a motorized gimbal platform, that operates under open loop or closed loop control to selectively position the jets relative to the combustion zone 10.

In the depicted embodiment of FIG. 1, the jet 17 is shown directed away from the combustion source 10 on the same side of the combustion source as the substrate 14. This position and angle results in a reduced pressure on this side of the combustion source 10 that vectors (or bends) the combustion source and the hot gasses toward the substrate 14. The amount of redirect is based on the positions and relative flow rates of both the redirect jet (11, 12 or 17) and the combustion source 10. To this end, the system may also include a flow controller for adjusting a flow rate of gas stream being projected from either one of the redirect jets (11, 12 or 17). The constituents of the coating as well as the combustible materials can be provided to the input 16 of the CCVD nozzle 15 as is known in prior art CCVD apparatus.

The redirect jet may be comprised of oxygen or air or may be a solid, gas or liquid material or precursor that forms part or all of the coating. Furthermore, the jet may provide additional combustible material or any combination of air, oxygen, gas, solids, precursor, solutes or solvent. While the basic embodiment uses a single redirect jet, multiple jets of similar or different materials may be used. The ability to use single or multiple redirect jets provides flexibility to the CCVD process here-before unseen. Various materials can be delivered to the combustion source at different locations and therefore at different optimal temperatures. Alternatively, several jets positioned in a fan-out pattern can be used to spread out the deposition materials to allow a more uniform, efficient and homogeneous deposition. Materials that could not be co-deposited by the conventional CVD process because of their different properties and sensitivities to excessive temperatures or vacuums can successfully be co-deposited using multiple jet redirected CCVD.

Figure 2:
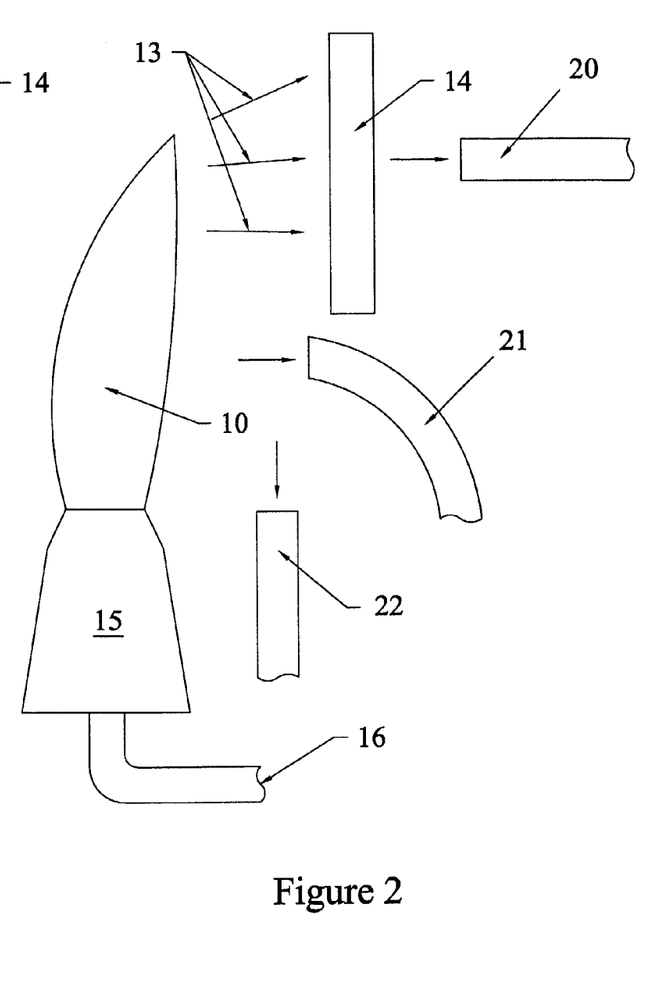
FIG. 2 is a schematic of a vacuum-equipped embodiment of the redirect CCVD apparatus.

FIG. 2 illustrates a vacuum-assisted redirect CCVD apparatus of the present invention. A vacuum source 20, 21 or 22 is used to redirect the hot gasses 13 produced by the CCVD combustion source 10 onto a substrate 14. As shown, the vacuum source can be positioned behind (20) the substrate 14, next to (22) the CCVD nozzle 15 or at some intermediate point (21). A single or multiple vacuum sources can be used. Multiple vacuum sources can be used to redirect the hot gasses 13 in several directions, thereby spreading out the gasses for increased deposition areas and more homogeneous coatings from a single or multiple, CCVD nozzle. As with jet-assisted redirected CCVD, the vacuum source allows for relatively high combustion temperatures, while decreasing the amount of heat transferred to the substrate 14. This provides the ability to deposit coatings on temperature sensitive substrates that otherwise could not be deposited using other methods, without damaging the substrate. It has even been found that coatings of platinum can be formed on NAFION™, as described in the example below. In addition to using one or more jet/vacuum sources, it should be noted that both pressure jets and vacuum sources can be used to provide flexibility in materials deposited, reduction in heat transferred to the substrate, as well as providing "flame-shaping" techniques.

As previously discussed, the redirect methods of the present invention are also useful with CVD or non-vapor chemical deposition processes that do not use a combustion or other concentrated energy source. With this in mind, nozzle 15 can be considered to be the output from a bubbler or other deposition gas source used in a CVD apparatus. The gasses emanating from nozzle 15 can be redirected using any of the above methods to direct, mix, spread out, cool or dilute the CVD deposition gasses or achieve any combination of these without the use of combustion or energy source 10.

As noted above, the apparatus and method of the present invention provide for low-temperature coating of polymers. Certain coatings, particularly oxide coatings, can be used to impart scratch-resistance to polymers. An important specific use of the present invention is the application of a very thin silica layer to polycarbonate to impart scratch-resistance to the polycarbonate such that the coated polycarbonate can be used for window applications, particularly automotive, rail, and aviation side windows. Polycarbonate is a transparent material having 90% light transmission and therefore has been used for non-breakable windows. A recognized problem with polycarbonate, however, is its tendency to scratch. It is desirable to impart sufficient scratch-resistance to polycarbonate so as to meet industry requirements for automotive, rail, and aviation side windows. To this end, the coated material should have a Taber abrasion of <10% Δ haze (ASTM D-1044), preferably <6% Δ haze, and most preferably <2% Δhaze. It is known to coat polycarbonate with silica to impart scratch-resistance to the polycarbonate, but such prior-art coatings have had to be in excess of 2000 nanometers in order to achieve the requisite scratch-resistance.

An important aspect of the present invention is that silica can be deposited on polycarbonate to a thickness of between about 100 nm and about 1800 nm, preferably between about 1000 and about 1500 nm and meet the Taber abrasion standard of <10% Δ haze, preferably <6% Δ haze, and most preferably <2% Δ haze. Polycarbonate is heat-sensitive and must be coated at surface temperatures of about 150° C. or below. The method and apparatus of the present invention facilitate such low temperature deposition of silica onto polycarbonate. While polycarbonate and silica are a particularly preferred combination for providing non-breakable windows, other polymers can be coated with thin layers of silica or other oxides to provide similar abrasion-resistance.

An important advantage of apparatus which redirects the flow of reaction gases is the ability to coat interior surfaces. As noted above, oxides coatings may be desirably applied to polymeric beverage containers, such as polyethylene terephthalate (PET) bottles to provide oxygen and carbon dioxide barrier properties. While such coatings may be applied to the outside of the container, it may be even more advantageous to coat the inside surface of bottles. Interior coatings, such as silica, not only enhance the gas barrier properties of the container but also provide a barrier against chemical migration. For flexibility, a polymeric container may contain plasticizers that over time might diffuse into the beverage and impart a "plastic" taste to the beverage. Furthermore, concerns have been raised about the safety of certain plasticizers, such as phthalate plasticizers.

Figure 4:
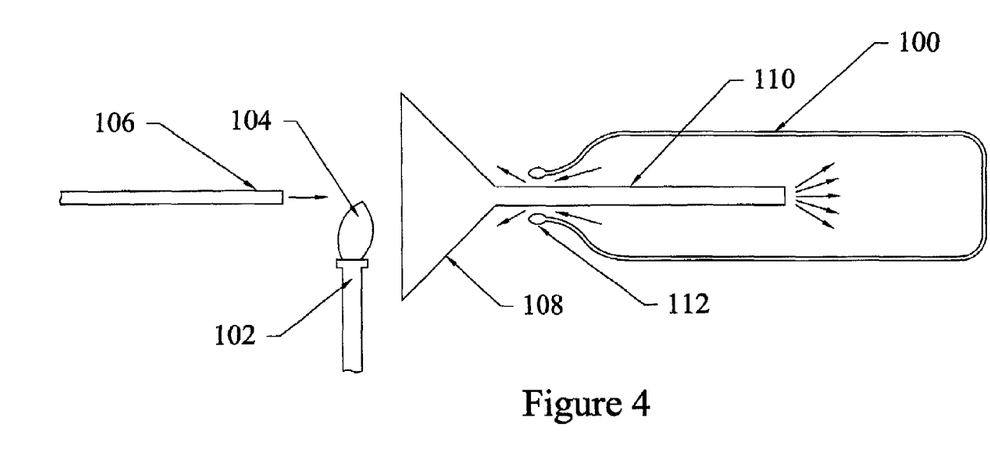
FIG. 4 is an illustration of apparatus for funneling CCVD combustion products into the interior of a bottle.

Illustrated in FIG. 4 is a bottle 100, the interior of which is being coated by apparatus in accordance with the invention. The stem 110 of a funnel 108 is inserted into the bottle 100. A CCVD deposition nozzle 102 is disposed to produce a flame 104 at a location below the funnel axis. A gas-directing nozzle 106 is shown normal to the flame for directing the combustion products of the CCVD flame into the funnel. The stem 110 has an outer diameter significantly less than the inner diameter of the bottle mouth 112, whereby exhaust gases exit between the stem 110 and bottle mouth. This method of coating the interior of a bottle has the advantage of minimizing heating of the interior of the bottle. On the other hand, it has the disadvantage of relatively low coating efficiency, i.e., the amount of coating deposited relative to amount of precursor chemical(s) expended.

Figure 5:
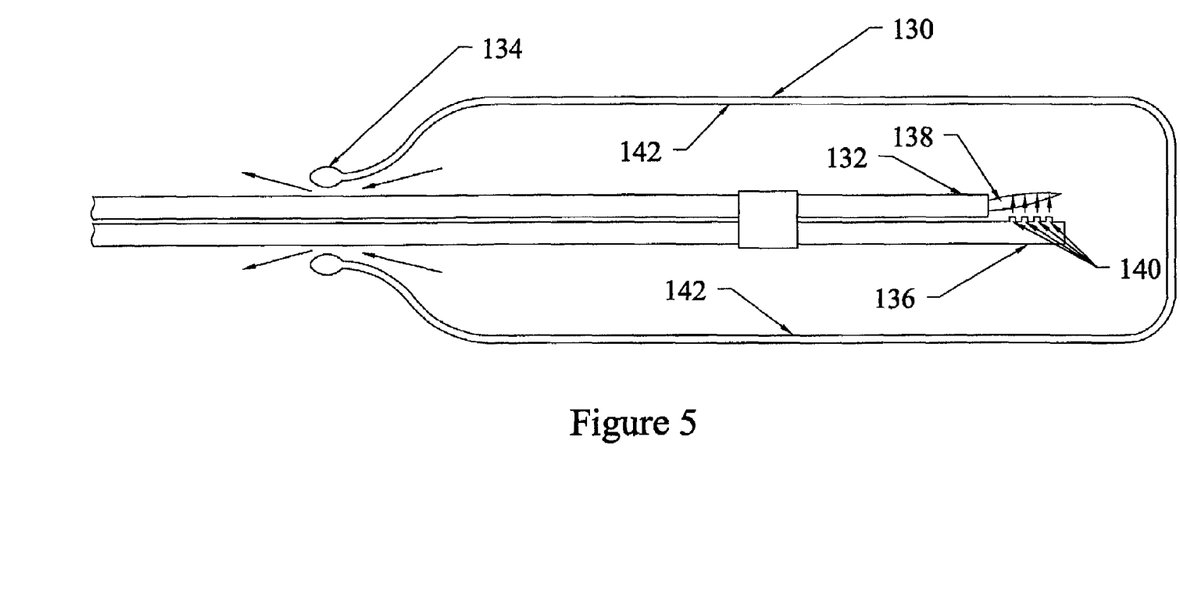
FIG. 5 is an illustration of re-direct CCVD apparatus in which combustion is carried out in the interior of a bottle.

A flame can actually be used inside a polymeric bottle 130 as shown in FIG. 5. An elongated, narrow, flame-producing nozzle 132 is shown inserted through the mouth 134 of the bottle 130. A second narrow, elongated, gas-conveying nozzle 136 is also inserted through the mouth 134 of the bottle 130. A flame 138 is produced at the end of nozzle 132. Openings 140 in the gas conveying nozzle 136 are shown directing gas in a direction generally normal to the flame, whereby combustion products of the flame are directed to the interior walls 142 of the bottle to deposit the coating, e.g., silica, thereon. So as to be able to maintain a flame within the confined interior of the bottle, the re-directing gas introduced through nozzle 136 is typically oxygen or contains a high proportion of oxygen. The nozzles, 132, 136 must be sufficiently thin relative to the inner diameter of the bottle mouth 134 to allow gases to exhaust through the mouth. So as not to overheat any particular portions of the bottle, means (not shown) may be provided to reciprocate the nozzles and bottle relative to each other in an axial direction and means (not shown) may be provided to rotate the bottle during deposition.

Figure 6:
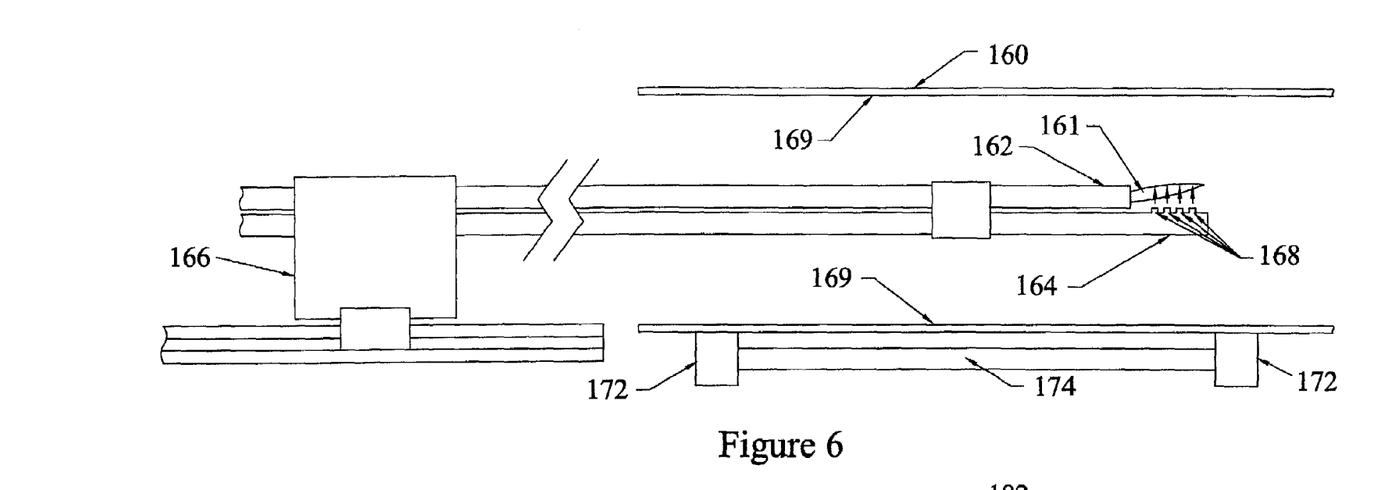
FIG. 6 is an illustration of a re-direct CCVD apparatus coating the interior of an elongated tube.

Another important interior coating application for re-direct apparatus is in coating the interior of tubes, e.g., with silica or another oxide, to provide corrosion resistance. Shown in FIG. 6 is a tube 160 being coated with apparatus very similar to that shown in FIG. 5. A flame nozzle 162 and re-directing gas nozzle 164 are jointly carried by a sting or robot arm 166 for reciprocating the nozzles axially through the tube 160. Openings 168 in the re-direct nozzle are oriented to redirect gases produced by the flame 161 towards the wall 169 of the tube. Apparatus, represented by a pair of wheels 172 mounted on a axle 174 and driven by an electric motor (not shown) rotate the tube during deposition to ensure uniform coating around the interior wall 169 of the tube 160.

Figure 7:
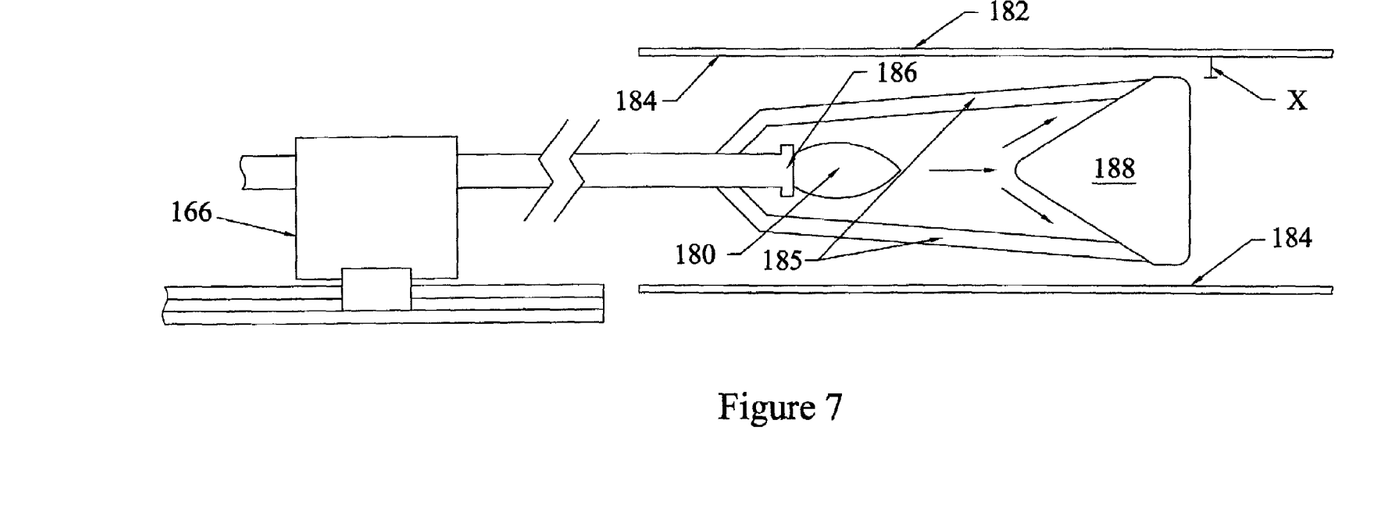
FIG. 7 is an illustration of a mechanical re-direct CCVD deflector being used to coat the interior of an elongated tube.

Illustrated in FIG. 7 is re-direct apparatus which uses mechanical means for redirecting combustion products of a CCVD flame 180 directed axially through a tube 182 to the interior wall 184 of the tube. Struts 185 extending from the CCVD nozzle 186 carry a cone-shaped deflector 188 which has an exterior diameter adapted to leave a constricted area (distance X) between it and the interior wall 184 of the tube 182. Gases produced by the flame 180 are re-directed by the deflector 188 to the interior tube wall 184. Typically, the exterior cone diameter is between about ½ to about 9/10 that of the inner diameter of the tube.

Figure 8A:
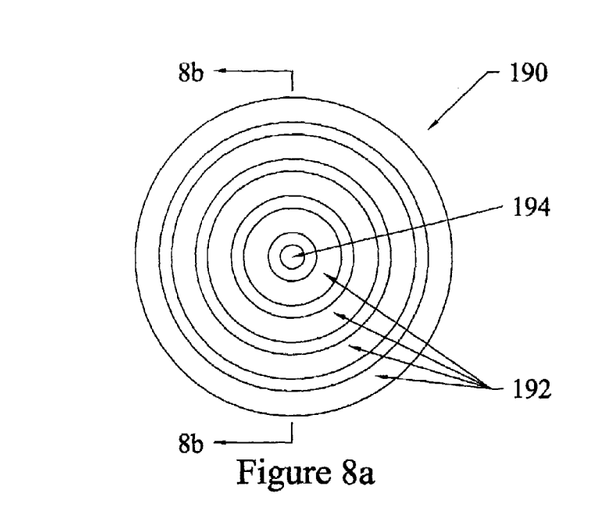
FIGS. 8a and 8b are illustrations of another embodiment of a deflector used to coat the interior of an elongated tube.
Figure 8B:
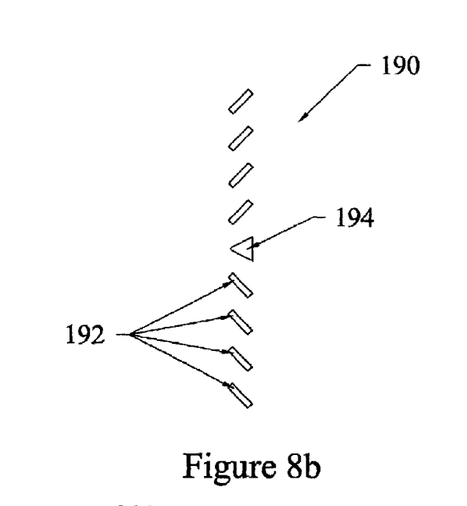

Other types of mechanical deflectors may also be used. Shown in FIG. 8a is an end view of a vane 190, while FIG. 8b is a cross-section of the vane 190 taken through line 8b. The vane 190 has a series of concentric foils 192 and a central cone-shaped deflector 194 for deflecting gases from an axial flame to the interior wall of a tube.

Figure 9:
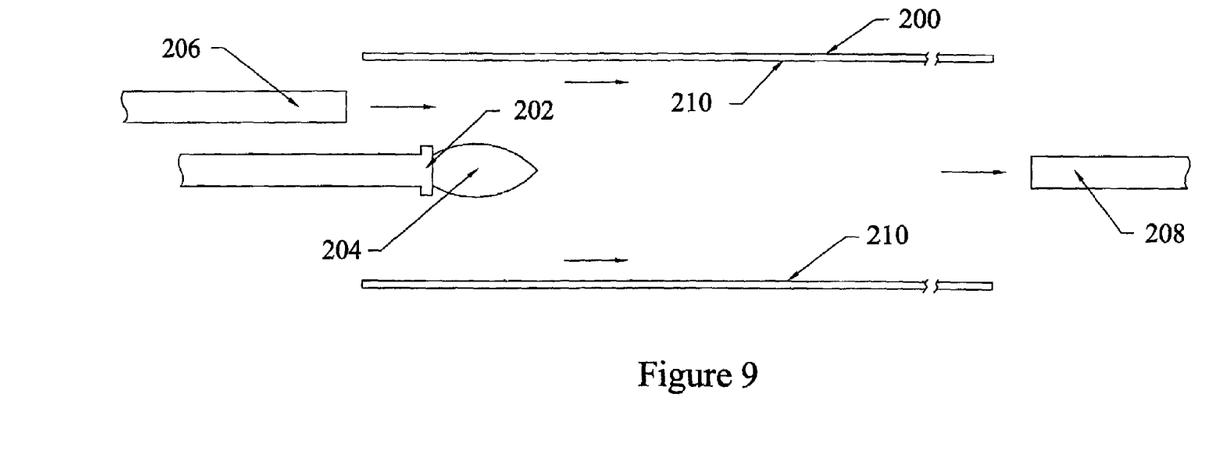
FIG. 9 is an illustration of a redirect method wherein a blower and a vacuum are used to channel CCVD gases through an elongated tube.

Illustrated in FIG. 9 illustrates a tube 200 in which a CCVD nozzle 202 produces a flame 204 directed axially through the tube. At the entrance end of the tube 200 is a blower 206 and at an exit end of the tube is a vacuum 208. In this case, the gas-re-directing means, i.e., the blower 206 and the vacuum 208, direct gas flow in the same direction, i.e., axially, as the orientation flame 204. In this case, the gas is redirected from a first, relatively localized path, to a second, more elongated path through the tube 200. By axially elongating the path along which the flame-produced products deposit on the tube, more uniform coating is achieved. Also, localized heating is avoided which may be disadvantageous in some cases, e.g., by producing localized thermal stresses. It is to be appreciated that either the blower 206 or vacuum 208 may be used alone. Likewise, it is to be appreciated that the blower 206 and/or or the vacuum 208 may be used in conjunction with the apparatuses shown in FIGS. 6, 7, 8a and 8b. It should also be noted that FIGS. 6, 7 and 9 show only part of the elongate tubes and coating apparatus, and both the elongate tubes and apparatus may have extremely long dimensions. One or more supports (not shown) may be used to maintain the centralized position of the coating apparatus within the tubes.

Figure 10:
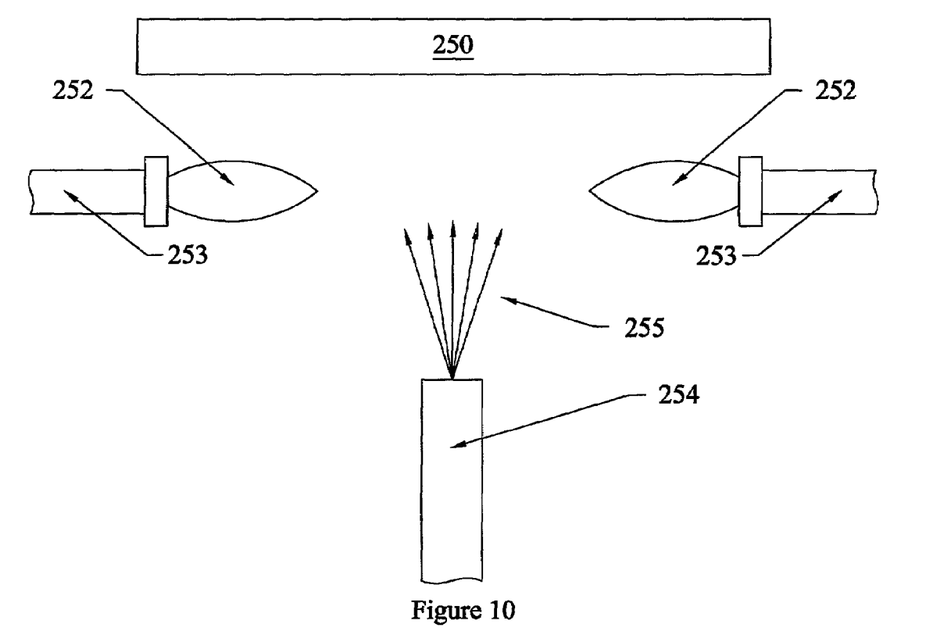
FIG. 10 is a diagrammatic illustration of a two-flame deposition apparatus using a third nozzle that directs a re-directing spray of fluid at the substrate.

Illustrated in FIG. 10 is a re-direct set-up in which a pair of nozzles 253 produce a pair of flames 252 each directed in opposed directions, each colinear and parallel to the surface of a substrate 250. A non-flame nozzel 254 directs a spray of fluid 255 through the region between the two flames 252 and ant the surface of the substrate 252. The spray 255 re-directs flame-produced vapor toward the surface of the substrate 250, whereby flame-produced material and material caried in the non-flame spray 254 are both deposited on the surface of the substrate 250. The two flames 252 need not be directed parallel to the surface in all instances, and other oblique angles may be used with respect to the substrate; however, in certain instances it had been found to be advantageous that the flames 252 are each directed parallel to the surface of the substrate 250. As one example of this deposition substrate, the flame producing solution may contain precursors for platinum and the non-flame fluid may be a solution of Nafion® in which carbon particulates are suspended. The resulting material will contain carbon and platinum particulates in a Nafion® membrane support, such material being useful as a gas diffusion/catalytic membrane of a fuel cell.

To describe certain examples of the systems, methods and materials of the invention, the following examples are provided, simply shown here as exemplary, as the redirect methods of the present invention are usable with any chemical deposition process. Once having read and understood the examples shown below, one of ordinary skill in the art should be able to apply these principles to other chemical deposition methods, and such applications are deemed to fall within the scope of the invention.

EXAMPLE 1

In this example, a Pt coating was formed on a polyimide substrate. A reagent solution was formed by first dissolving 2.7 g Pt-cod in 278 ml toluene. The resulting solution was then mixed with 136 g of propane. This solution was delivered to the CCVD nozzle at a rate of 3.00 ml/min., using oxygen as the carrier gas. The CCVD apparatus was a distance of 12.7 cm from the polyimide substrate, with a deposition gas temperature of 180 degrees C. just at the substrate. The redirect apparatus of FIG. 1 was used, with the CCVD flame extending parallel to the substrate and the redirect air jet at right angles to both the CCVD flame and the substrate. The redirect air jet was directed into the last section of the visible light emitting flame approximately 7.7 cm from the base of the flame and the end of the redirect tube was 1.5 cm from the centerline of the flame. The redirect cooling air was supplied at 100 psi at a rate of 44 l/min. The deposition was performed for 15 minutes in the open atmosphere with the redirect CCVD apparatus held stationary relative to the substrate. The initial weight of the substrate was 23.6685 g and the final weight after deposition of the Pt coating was 23.6709 g. A tape test for adhesion was performed on the sample, and the metallic, specular, conductive coating passed the test without peeling from the polyimide substrate.

The redirected chemical deposition methods have also been employed for producing membrane electrode assemblies, such as those disclosed in co-pending U.S. patent application Ser. No. 09/316,855 filed May 21, 1999 and entitled "MATERIALS AND PROCESSES FOR PROVIDING FUEL CELLS AND ACTIVE MEMBRANES." These membrane electrode assemblies include a co-deposited layer of Nafion®, graphite and platinum on each of their major surfaces. Although platinum is the most common catalyst, other materials such as iridium, rhodium, osmium and ruthenium may also be used. As these co-deposited materials have different deposition temperature requirements, the redirect methods of the present invention are particularly suited for producing these membranes.

EXAMPLE 2

In this example, a Pt coating was formed on a NF 112 NAFION® (a hydrated sulfur containing polymeric membrane produced by the DuPont® Company) substrate. A reagent solution was formed by first dissolving 2.7 g Pt-cod in 278 ml toluene. The resulting solution was then mixed with 136 g of propane. This solution was delivered to the CCVD nozzle at a rate of 3.00 ml/min., using oxygen as the carrier gas. The CCVD apparatus was a distance of 12.7 cm from the NAFION® substrate, with a deposition gas temperature of 180 degrees C., just at the substrate. The redirect apparatus of FIG. 1 was used, with the CCVD flame extending parallel to the substrate and the redirect air jet at right angles to both the CCVD flame and the substrate. The redirect air jet was directed 7.7 cm from the base of the flame and the end of the redirect tube was 1.5 cm from the centerline of the flame. The redirect cooling air was supplied at 100 psi at a rate of 44 l/min. The deposition was performed for 10 minutes in the open atmosphere with the redirect CCVD apparatus held stationary relative to the substrate. There was no deformation of the NAFION® substrate.

EXAMPLE 3

In this example, Pt and NAFION® were co-deposited on a Cu substrate. A reagent solution was formed by first dissolving 2.7 g Pt-cod in 278 ml toluene. The resulting solution was then mixed with 136 g of propane. This solution was delivered to the CCVD nozzle at a rate of 3.00 ml/min., using oxygen as the carrier gas. The CCVD apparatus was a distance of 12.7 cm from the copper substrate, with a deposition gas temperature of 180 degrees C., just at the center of the substrate surface. The temperature was also measured toward the edge of the substrate at 150 degrees C. The redirect apparatus of FIG. 1 was used, with the CCVD flame extending parallel to the substrate and the redirect jet at right angles to both the CCVD flame and the substrate. The redirect jet was directed 7.7 cm from the base of the flame and the end of the redirect tube was 1.5 cm from the centerline of the flame. The redirect jet was comprised of a cooling air and a 5.1% wt solution of NAFION® dissolved in a 50/50 mixture of water and isopropyl alcohol. This mixture was supplied as a redirect jet at 100 psi with a flow rate of 5.0 ml/min. The deposition was performed for 7 minutes in the open atmosphere with the redirect CCVD apparatus held stationary relative to the substrate. A more intense Pt color was observed toward the edge of the substrate where the 150 degrees C. temperature was recorded, which was away from the impact area of the NAFION® material.

One particularly useful application of the disclosed methods is for producing insulative coverings for electrical conductors or superconductors. These conductors may be planer or in the form of wires and more specifically for windings of electromagnetic devices. In electromagnetic devices, including motors, solenoids, transducers, transformers, inductors, etc., the efficiency of the device is, in part, a function of the number of windings per cross section. More specifically, the efficiency is based on the copper cross sectional area. By decreasing the thickness of the insulation (while still providing the required electrical breakdown insulation), the number of windings per cross sectional area can be increased, and/or the overall conductive cross sectional area is increased. Oxide insulators that are relatively thin (as thin as 1.5 microns) have been here-before made with sufficient breakdown voltages for use in electromagnetic devices. The present invention goes a step further by providing ultra thin oxide conductors (less than one micron thick) with breakdown voltages comparable with insulators of this type that have greater thicknesses.

EXAMPLE 4

Figure 3:
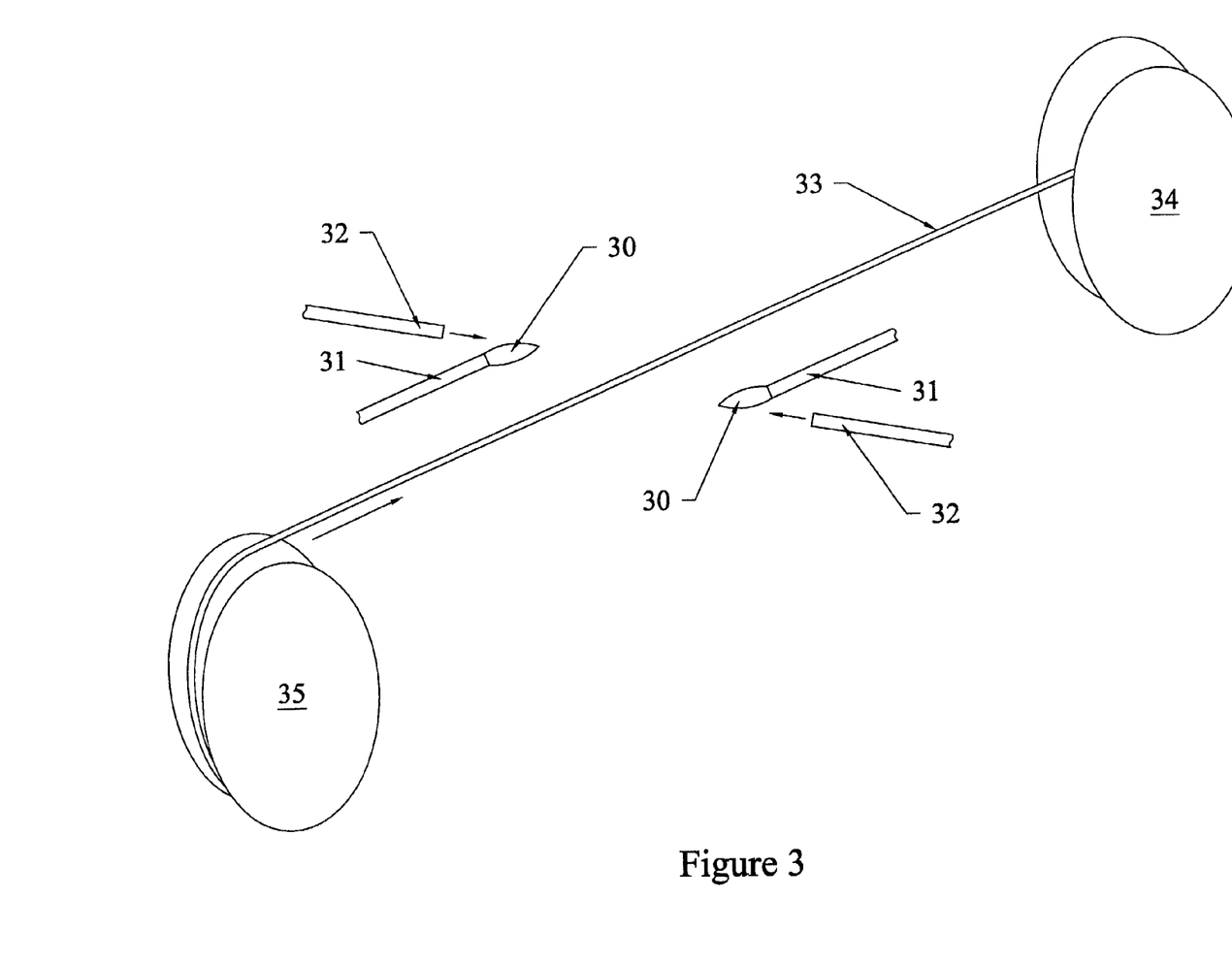
FIG. 3 is a view of a redirect CCVD apparatus used to form insulating coatings on electrical wiring.

In this example, $SiO_2$ was deposited on a 24# Cu wire substrate using a jet-assisted redirect CCVD apparatus having two CCVD nozzles and redirect jets as shown in FIG. 3. A reagent solution was formed by first dissolving 126.5 g of TEOS in 68.9 g of isopropyl alcohol. The resulting solution was then mixed with 2067 g of propane. This solution was delivered to each CCVD nozzle 31 at a rate of 2.00 ml/min., using oxygen as the carrier gas. The redirect air jet tubes 32 were 6.5 cm from the base of the CCVD flames 30 and provided 44 l/min. of redirect air. The wire 33 was advanced from one spool 34 to the other 35 at a rate of 320 cm/hr. The resulting wire had a breakdown voltage of 560 Volts with a silica coating of less than 0.5 microns. Similarly coated wires had insulative silica coatings that measured as little as 60.5 nanometers, using an SEM/EDX instrument.

EXAMPLE 5

In this example, $SiO_2$ was deposited on a biaxially-oriented polypropylene (BOPP/Milkboard) substrate, using a jet-assisted redirect CCVD apparatus having a single CCVD nozzles and two air jets (one predominately for redirect and one predominately for cooling the substrate). A reagent solution was formed by first dissolving 26.4 g of TEOS in 50.5 g of toluene. The resulting solution was then mixed with 200 g of propane. This solution was delivered to the CCVD nozzle at a rate of 3.00 ml/min., using oxygen as the carrier gas. One redirect air jet tube was 8.0 cm from the base of the CCVD flame and one was located 14.5 cm from the base of the CCVD flame. The flame was parallel to the substrate and 11 cm spaced therefrom, with both redirect jets positioned perpendicular to the flame and substrate. The redirect CCVD apparatus was moved in a rastering pattern across the substrate over a 15 minute deposition period. The resulting laminate had an oxygen transmission rate (OTR) of 64 cc/m²xday. For comparison, the non-coated BOPP had an OTR of 2350 cc/m²xday.

EXAMPLE 6

In this example, Pt doped $SiO_2$ was deposited on a LDPE coated paper substrate, using a jet-assisted redirect CCVD apparatus having a single CCVD nozzles and a single redirect air jet. A reagent solution was formed by first dissolving 0.86 g Pt-cod, 4.26 g of TEOS in 74 g of toluene. The resulting solution was then mixed with 105 g of propane. This solution was delivered to the CCVD nozzle at a rate of 3.00 ml/min., using oxygen as the carrier gas. The redirect air jet tube was 8.0 cm from the base of the CCVD flame and 7.5 cm from the substrate. The flame was parallel to the substrate and 7.5 cm spaced therefrom, with the redirect jet positioned perpendicular to the flame and substrate. The redirect CCVD apparatus was moved in a rastering pattern across the substrate over a 60 minute deposition period. The resulting laminate had an OTR of 841 cc/m²xday. For comparison, the non-coated LDPE paper had an OTR of 6800 cc/m²xday.

EXAMPLE 7

In this example, Mg doped $SiO_2$ was deposited on a PET soda bottle substrate, using a jet-assisted redirect CCVD apparatus having a single CCVD nozzles and a single redirect air jet. A reagent solution was formed by first dissolving 14.08 g of TEOS and 30 g of Mg-naphthenate in 22.12 g of toluene. The resulting solution was then mixed with 110 g of propane. This solution was delivered to the CCVD nozzle at a rate of 8.00 ml/min., using oxygen as the carrier gas. The redirect air jet tube was 8.0 cm from the base of the CCVD flame and 7.0 cm from the substrate. The flame was parallel to the surface of the substrate and 7.0 cm spaced therefrom, with the redirect jet positioned perpendicular to the flame and substrate surface. The redirect CCVD apparatus was moved up and down at 254 cm/min, while the bottle was rotated such that the scan rate across its surface was 25.4 cm/min. The coated bottle had a 1.4/1.0 improvement in its OTR.

EXAMPLE 8

In this example, Si was deposited on Borosilicate, float, and Sungate 300 glass using a jet redirect CCVD apparatus having a single linear flame nozzle and a single redirect air jet producing a local low pressure zone affecting the flame, similar to jet 17 in FIG. 1. A reagent solution was formed by first dissolving 5 mL of Tetramethylsilane 300 g of propane. The resulting solution had a concentration of 0.07 M Si. The solution flow rate was 5 mL/min with a pressure of 1200 psi. This solution was atomized and delivered using a mixture of oxygen and air as the carrier gas. This mixture was then premixed with methane. The redirect air jet nozzle was 2.5 cm from the centerline of the CCVD flame and 5-10 cm from the substrate. The flame was parallel to the substrate, with the redirect jet positioned at approximately 60° with respect to the substrate. The coatings were deposited at 270° C. to 390° C. for 38 minutes onto the Borosilicate, float, and Sungate 300 glass substrates. Analysis of the coated glass revealed silica was deposited. The successful coating deposition using a redirect jet producing local low-pressure zone near the nozzle exit illustrates that the present invention is not limited to deposition using jet-assisted apparatus where the flame is cut by the redirect jets.

EXAMPLE 9

A precursor solution was prepared containing 158.4 g tetraethoxysilane (1.5 wt % in toluene), 82.4 g. toluene, and 1040 g. propane. CCVD deposition conditions are as per the table below.

| PARAMETER | A | B | C |
| --- | --- | --- | --- |
| Time (minutes) | 90 | 90 | 90 |
| Flow, ml/min | 8 | 8 | 8 |
| Temp. ° C. | 150 | 150 | 147 |
| Pressure (psi) | 31 | 693 | 553 |
| P $O_2$, psi | 80 | 80 | 80 |
| Flow $O_2$, 1 pm | 47 | 44 | 47 |
| Variac (amperes) | 35 | 325 | 40 |
| Redirect Flow (1 pm) | 44 | 44 | 44 |
| Redirect to Substrate distance (mm) | 24 | 24 | 26.5 |
| Redirect to Nozzle distance (mm) | 85 | 85 | 85 |
| Hood Flow, (1 pm) | 15 | 3 | 15 |
| Taber Resist.Δ haze | 1.42 | 1.66 | 1.02 |

Figure 11:
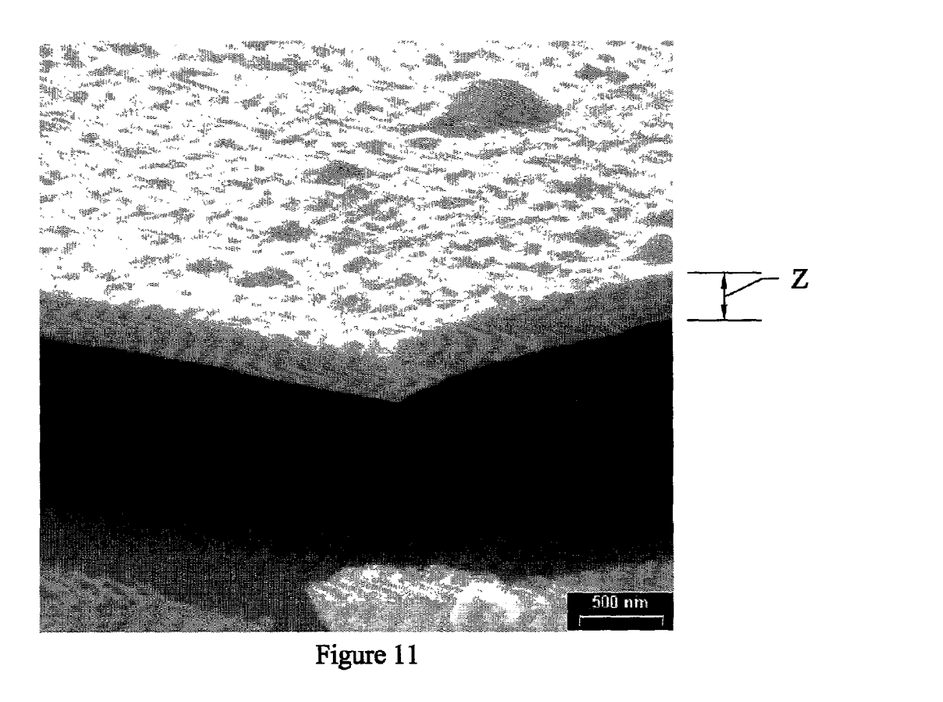
FIG. 11 is an electron micrograph of a silica coating on polycarbonate.

An electronmicrograph of the silica coating on polycarbonate is shown in FIG. 11. The thickness, distance (Z) was 600 nanometers.

It is to be understood that the terminology used herein is for the purpose of describing particular embodiments only and is not intended to be limiting. It must be noted that, as used in the specification and the appended claims, the singular forms "a," "an" and "the" include plural referents unless the context clearly dictates otherwise.

Throughout this application, where publications are referenced, the disclosures of these publications in their entireties are hereby incorporated by reference into this application in order to more fully describe the state of the art to which this invention pertains.

It should be apparent to those skilled in the art that various modifications or variations could be made to the present invention without departing from the scope of the invention. Other embodiments of the invention would be apparent to those skilled in the art from review of the specification disclosed herein. It is intended that the specification be considered as exemplary only, with the true scope of the invention being indicated by the following claims.

What is claimed is:

1. A method of forming a material, said method comprising:
   (a) providing at least one energy source derived from a chemical reaction(s), said at least one energy source being the predominant source of energy for said method;
   (b) feeding a precursor material along a first path into a localized environment of the at least one energy source under conditions tat said energy source causes combustion of at least one component of said precursor material to produce combustion products that continue along said first path; and
   (c) providing at least one redirecting gas flow source and applying the at least one redirecting gas flow to the first path combustion products, to thereby redirect the combustion products from the first path to a redirected path at an angle relative to said first path, to thereby cause the combustion products to contact a surface and form at least part of the material.

2. The method of claim 1, wherein causing the combustion products to contact a surface includes contacting a substrate to form a coating of the material thereon.

3. The method of claim 2, wherein die coating is formed less than 5 microns in thickness.

4. The method of claim 2, wherein the coating is formed less than 0.5 microns in thickness.

5. The method of claim 1, wherein the localized environment is within 20 cm of the energy source.

6. The method of claim 1, wherein the localized environment is within 10 cm of the energy source.

7. The method of claim 1, wherein the localized environment is within 5 cm of the energy source.

8. The method of claim 1, wherein the localized environment is within 2 cm of the energy source.

9. The method of claim 1 further including a second energy source to promote said chemical reaction(s).

10. The method of claim 1 wherein said material forms a coating on said surface.

11. The method of claim 10 wherein the coating is less than 5 microns in thickness.

12. The method of claim 10 wherein the coating is less than 0.5 micron in thickness.

13. A method of forming a material, said method comprising:
   (a) providing at least one energy derived from a chemical reaction(s), said at least one energy source being the predominant source of energy for said method;
   (b) providing a liquid precursor material;
   (c) feeding a liquid precursor material into a localized environment of the at least one energy source under conditions that said energy source causes combustion of at least one component of said precursor material to produce combustion;
   (d) directing the combustion products along a first path; and
   (e) providing at least one source of pressure differential and applying the at least one source of pressure differential to the localized environment of the at least one energy source, such that the localized environment is selectively changed to redirect the combustion products from the first path to a redirected path at an angle relative to said first path, to thereby cause the combustion products to contact a surface and form at least part of the material.

14. The method of claim 13, wherein applying to the localized environment the at least one source of pressure differential includes diluting combustion product gasses by at least 10%.

15. The method of claim 13, wherein applying to the localized environment the at least one source of pressure differential includes diluting combustion product gasses by at least 30%.

16. The method of claim 13, wherein applying to the localized environment the at least one source of pressure differential includes diluting combustion product gasses by at least 60%.

17. The method of claim 13, wherein applying to the localized environment the at least one source of pressure differential includes diluting combustion product gasses by at least 100%.

18. The method of claim 13, wherein the change to the localized environment caused by providing the at least one source of pressure differential includes cooling combustion product gasses by at least 10% compared to the temperature of the energy source relative to the temperature of the surface.

19. The method of claim 13, wherein the change to the localized environment caused by providing the at least one source of pressure differential includes cooling combustion product gasses by at least 25% compared to the temperature of the energy source relative to the temperature of the surface.

20. The method of claim 13, wherein the change to the localized environment caused by providing the at least one source of pressure differential includes cooling combustion product gasses by at least 50% compared to the temperature of the energy source relative to the temperature of the surface.

21. The method of claim 13, wherein the change to the localized environment caused by providing the at least one source of pressure differential includes cooling combustion product gasses by at least 70% compared to the temperature of the energy source relative to the temperature of the surface.

22. The method of claim 13, wherein the localized environment comprises a pressurized environment having any pressure between 1-10,000 torr.

23. A method of forming a material, said method comprising:

(a) providing at least one energy source derived from a chemical reaction(s), said at least one energy source being the predominant source of energy for said method;
(b) feeding a precursor material into a localized environment of the at least one energy source under conditions that said energy source causes combustion of at least one component of said precursor material to produce combustion products,;
(c) directing the combustion products along a first path; and
(d) providing at least one source of pressure differential and applying the at least one source of pressure differential to the localized environment of the at least one energy source, such tat the localized environment is selectively changed to redirect the combustion products from the first path to a redirected path at an angle relative to said first path, to thereby cause the gasses combustion products to contact a surface and form at least part of the material in an atmospheric environment.

24. A method of forming a material, said method comprising:
(a) providing at least one energy source derived from a chemical reaction(s), said at least one energy source being the predominant source of energy for said method;
(b) feeding a precursor material within gasses, the gasses including liquid that is at least partially vaporized, into a localized environment of the at least one energy source, to allow the at least one energy source to cause combustion of the precursor material and/or the gasses and thereby produce combustion products;
(c) directing the combustion products along a first path; and
(d) providing at least one source of pressure differential and applying the at least one source of pressure differential to the localized environment of the at least one energy source, such that the localized environment is selectively changed to redirect the combustion products from the first path to a redirected path at an angle relative to said first path, to thereby cause the combustion products to contact a surface and form at least part of the material.

25. The method of claim 24, wherein the localized environment comprises a pressurized environment having any pressure between 1-10,000 torr.

26. A method of forming a material, said method comprising:
(a) providing at least one combustion source derived from a chemical reaction(s), said at least one energy source being the predominant source of energy for said method;
(b) feeding a precursor material into a localized environment of the at least one combustion source, to allow the at least one combustion source to activate the precursor material within gasses and thereby produce combustion products;
(c) directing the combustion products along a first path; and
(d) providing at least one source of pressure differential and applying the at least one source of pressure differential to the localized environment of the at least one combustion source, such that the localized environment is selectively changed to redirect the combustion products from the first path to a redirected path at an angle relative to said first path, to thereby cause the combustion products to contact a surface and form at least part of the material.

27. The method of claim 26 wherein providing at least one source of pressure differential comprises providing at least one source of pressurized fluid.

28. The method of claim 27 wherein the pressurized fluid is a gas.

29. The method of claim 28 wherein the pressurized gas is directed close to, but not directly at the at least one combustion source, thereby forming the pressure differential that redirects the combustion products toward the surface.

30. The method of claim 28 wherein the pressurized gas intercepts the gas flow out of the at least one combustion source, thereby redirecting the combustion products toward the surface.

31. The method of claim 27 wherein the pressurized fluid contains a liquid.

32. The method of claim 27 wherein:
(a) the pressurized fluid comprises an additional precursor; and
(b) the combustion source causes the additional precursor to react to create additional combustion products that form at least part of the material.

33. The method of claim 27 wherein:
(a) the pressurized fluid comprises additional material; and
(b) the additional material forms at least part of the formed material.

34. The method of claim 26 wherein the at least one source of pressure differential includes at least one source of vacuum.

35. The method of claim 26 wherein the at least one source of pressure differential includes at least two sources of pressure differential.

36. The method of claim 35 wherein the at least two sources of pressure differential includes at least one source of vacuum and at least one source of pressurized fluid.

37. The method of claim 26, wherein the localized environment comprises a pressurized environment having any pressure between 1-10,000 torr.

* * * * *